(12) United States Patent
Lee et al.

(10) Patent No.: US 8,289,261 B2
(45) Date of Patent: Oct. 16, 2012

(54) GATE DRIVING CIRCUIT AND DISPLAY DEVICE HAVING THE SAME

(75) Inventors: Min-Cheol Lee, Seoul (KR); Yong-Soon Lee, Cheonan-si (KR)

(73) Assignee: Samsung Display Co., Ltd., Yongin (KR)

( * ) Notice: Subject to any disclaimer, the term of this patent is extended or adjusted under 35 U.S.C. 154(b) by 724 days.

(21) Appl. No.: 12/507,316

(22) Filed: Jul. 22, 2009

(65) Prior Publication Data

US 2010/0039363 A1   Feb. 18, 2010

(30) Foreign Application Priority Data

Aug. 14, 2008  (KR) .................. 10-2008-0080042

(51) Int. Cl.
  *G09G 3/36*   (2006.01)
(52) U.S. Cl. .......... 345/100; 345/99; 345/204; 324/333; 365/230.06; 365/233.11; 377/68; 377/72; 377/74
(58) Field of Classification Search ............. 345/99, 345/100, 204–213; 327/333, 541; 365/230.06, 365/233.11; 377/68, 72, 74, 77–79
See application file for complete search history.

(56) References Cited

U.S. PATENT DOCUMENTS

| | | | | |
|---|---|---|---|---|
| 7,880,503 B2* | 2/2011 | Kwon et al. | ..................... | 326/83 |
| 7,899,148 B2* | 3/2011 | Kang et al. | ..................... | 377/64 |
| 7,911,436 B2* | 3/2011 | Lee et al. | ..................... | 345/100 |
| 7,932,887 B2* | 4/2011 | Kim et al. | ..................... | 345/100 |
| 7,936,332 B2* | 5/2011 | Lee et al. | ..................... | 345/100 |
| 7,956,855 B2* | 6/2011 | Park | ..................... | 345/204 |
| 8,049,706 B2* | 11/2011 | Tsou | ..................... | 345/100 |
| 8,098,227 B2* | 1/2012 | Lee et al. | ..................... | 345/100 |
| 8,134,529 B2* | 3/2012 | Kim et al. | ..................... | 345/98 |
| 8,144,299 B2* | 3/2012 | Ko et al. | ..................... | 349/149 |
| 8,159,446 B2* | 4/2012 | Lee et al. | ..................... | 345/100 |
| 8,174,478 B2* | 5/2012 | Kim et al. | ..................... | 345/100 |
| 8,179,355 B2* | 5/2012 | Lee et al. | ..................... | 345/99 |
| 2005/0275609 A1* | 12/2005 | Lee et al. | ..................... | 345/82 |
| 2005/0275614 A1* | 12/2005 | Kim et al. | ..................... | 345/100 |
| 2006/0017686 A1* | 1/2006 | Park | ..................... | 345/100 |
| 2006/0022201 A1* | 2/2006 | Kim et al. | ..................... | 257/72 |
| 2006/0038500 A1* | 2/2006 | Lee et al. | ..................... | 315/169.1 |
| 2006/0056267 A1* | 3/2006 | Kim et al. | ..................... | 365/230.06 |
| 2006/0061562 A1* | 3/2006 | Park et al. | ..................... | 345/204 |
| 2006/0267912 A1* | 11/2006 | Lee et al. | ..................... | 345/100 |
| 2007/0018940 A1* | 1/2007 | Park | ..................... | 345/100 |
| 2007/0040793 A1* | 2/2007 | Kim et al. | ..................... | 345/100 |
| 2007/0146289 A1* | 6/2007 | Lee et al. | ..................... | 345/100 |

(Continued)

*Primary Examiner* — Lun-Yi Lao
*Assistant Examiner* — Priyank Shah
(74) *Attorney, Agent, or Firm* — H.C. Park & Associates, PLC

(57) ABSTRACT

A gate driving circuit that may be capable of improving driving margin and maintaining reliability even after long use, and a display device having the gate driving circuit. The gate driving circuit includes a shift register having a plurality of stages dependently connected to one another, wherein each stage includes a pull-up unit outputting a first clock signal as a gate signal in response to a signal of a first node, to which a first input signal is applied, a pull-down unit discharging the gate signal to a gate-off voltage in response to a second input signal, a discharging unit discharging the signal of the first node to the gate-off voltage in response to the second input signal, and a holding unit maintaining the signal of the first node at the gate-off voltage in response to a delay signal of the first clock signal.

16 Claims, 6 Drawing Sheets

U.S. PATENT DOCUMENTS

| | | |
|---|---|---|
| 2007/0296662 A1* | 12/2007 | Lee et al. .......................... 345/87 |
| 2007/0296681 A1* | 12/2007 | Kim et al. ...................... 345/100 |
| 2008/0001904 A1* | 1/2008 | Kim et al. ...................... 345/100 |
| 2008/0012816 A1* | 1/2008 | Moon ............................ 345/100 |
| 2008/0036725 A1* | 2/2008 | Lee et al. ...................... 345/100 |
| 2008/0042950 A1* | 2/2008 | Park et al. ...................... 345/87 |
| 2008/0074379 A1* | 3/2008 | Kim et al. ........................ 345/99 |
| 2008/0100560 A1* | 5/2008 | Na et al. ......................... 345/101 |
| 2008/0122829 A1* | 5/2008 | Park ............................... 345/213 |
| 2008/0165110 A1* | 7/2008 | Kim et al. ........................ 345/99 |
| 2009/0040203 A1* | 2/2009 | Kim et al. ..................... 345/204 |
| 2009/0102779 A1* | 4/2009 | Jo ................................. 345/101 |
| 2009/0189677 A1* | 7/2009 | Lee et al. ...................... 327/427 |
| 2010/0007635 A1* | 1/2010 | Kwon et al. .................. 345/204 |
| 2010/0182227 A1* | 7/2010 | Tsou ............................. 345/100 |
| 2010/0207667 A1* | 8/2010 | Kwon et al. .................. 327/108 |

* cited by examiner

GATE DRIVING CIRCUIT AND DISPLAY DEVICE HAVING THE SAME

CROSS-REFERENCE TO RELATED APPLICATION

This application claims priority from and the benefit of Korean Patent Application No. 10-2008-0080042, filed on Aug. 14, 2008, which is hereby incorporated by reference for all purposes as if fully set forth herein.

BACKGROUND OF THE INVENTION

1. Field of the Invention

The present invention relates to a gate driving circuit and a display device having the gate driving circuit, and more particularly, to a gate driving circuit that may be capable of improving driving margin and maintaining reliability even after long use, and a display device having the gate driving circuit.

2. Discussion of the Background

In recent years, the demand for flat panel displays such as a plasma display panel (PDP), a plasma-addressed liquid crystal (PALC) display, a liquid crystal display (LCD), and an organic light-emitting diode (OLED) display has dramatically increased because conventional cathode ray tube (CRT) devices do not meet the demand for thin, large-scale display devices. Since flat panel display devices can provide high picture quality and are light-weight and thin, they have been widely used in various electronic devices.

In general, LCD devices include a lower display panel having a plurality of thin-film transistors (TFTs) arranged thereon, an upper display panel facing the lower display panel, and a liquid crystal layer interposed between the lower display panel and the upper display panel. The LCD displays an image by adjusting the intensity of an electric field applied to the liquid crystal layer. Display devices also include a data driving module and a gate driving module to drive the display panel.

The gate driving module may include a gate driving integrated circuit (IC). The gate driving IC may be mounted using a tape carrier package (TCP) or chip-on-glass (COG) method. However, as part of the effort to reduce the manufacturing cost and size of display devices and facilitate the design of display devices, methods have been suggested in which a gate driving module, which generates a gate signal using an amorphous silicon (a-Si) TFT is directly mounted on the glass substrate of a display panel without a gate driving IC.

If a gate driving module is directly mounted on a display panel, however, the gate driving module may occupy too much space in the display panel. To address this, the size of the gate driving module may be reduced. However, maintaining the driving capability of the gate driving module and assuring reliability after long use are problems that remain to be overcome.

SUMMARY OF THE INVENTION

The present invention provides a gate driving circuit that may be capable of improving driving margin and maintaining reliability even after long use.

The present invention also provides a display device having a gate driving circuit that may be capable of improving driving margin and maintaining reliability even after long use.

Additional features of the invention will be set forth in the description which follows, and in part will be apparent from the description, or may be learned by practice of the invention.

The present invention discloses a gate driving circuit including a shift register having a plurality of stages dependently connected to one another, wherein each stage includes a pull-up unit outputting a first clock signal as a gate signal in response to a signal of a first node, to which a first input signal is applied, a pull-down unit discharging the gate signal to a gate-off voltage in response to a second input signal, a discharging unit discharging the signal of the first node to the gate-off voltage in response to the second input signal, and a holding unit maintaining the signal of the first node at the gate-off voltage in response to a delay signal of the first clock signal.

The present invention also discloses a display device including a display panel including a plurality of pixels and a plurality of signal lines connected to the plurality of pixels, a shift register having a plurality of stages dependently connected to one another, wherein each stage is respectively connected to a signal line of the plurality of signal lines and each stage includes a pull-up unit outputting a first clock signal as a gate signal in response to a signal of a first node, to which a first input signal is applied, a pull-down unit discharging the gate signal to a gate-off voltage in response to a second input signal, a discharging unit discharging the signal of the first node to the gate-off voltage in response to the second input signal, and a holding unit maintaining the signal of the first node at the gate-off voltage in response to a delay signal of the first clock signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
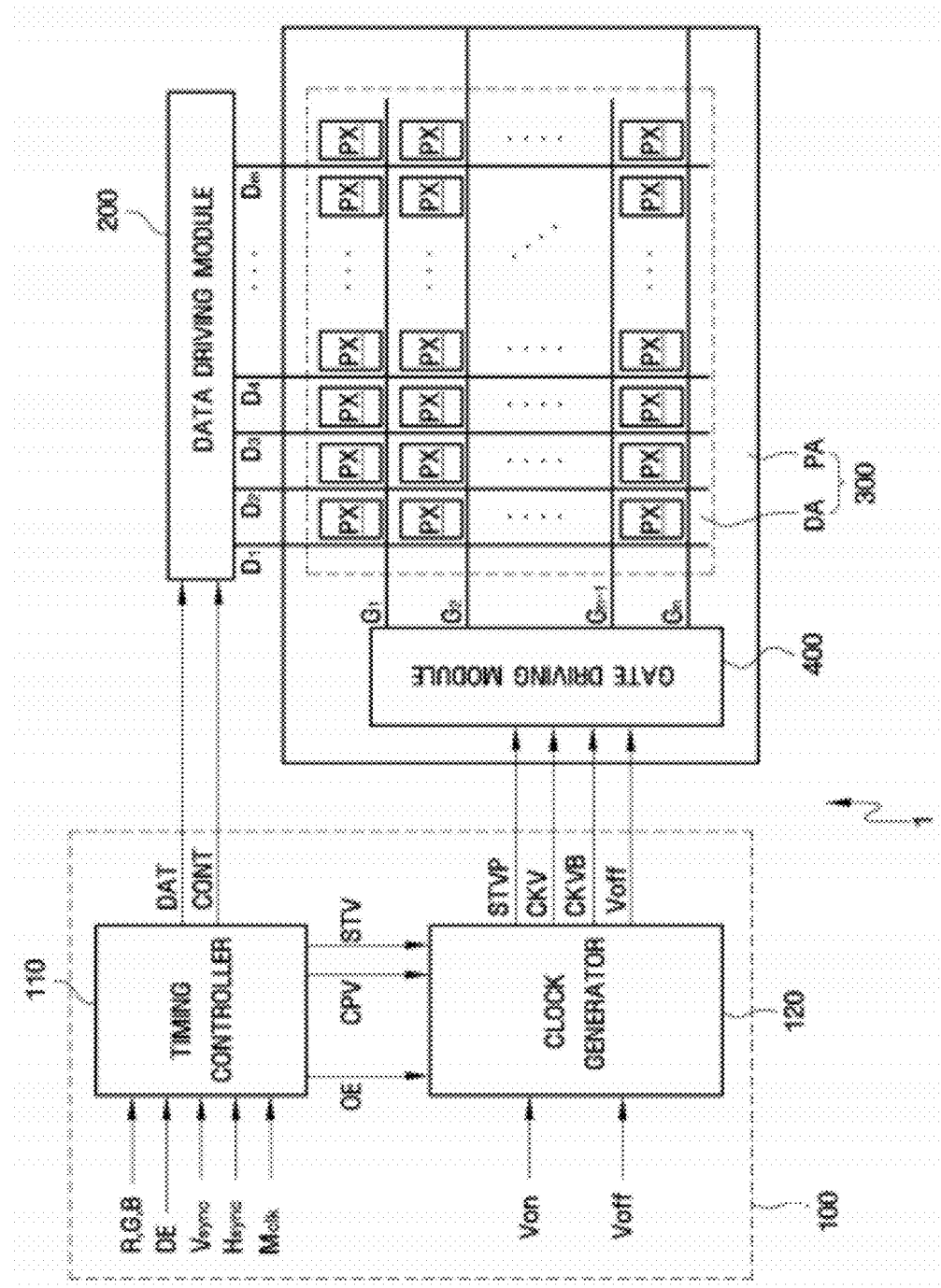
FIG. 1 shows a block diagram of a display device according to an exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
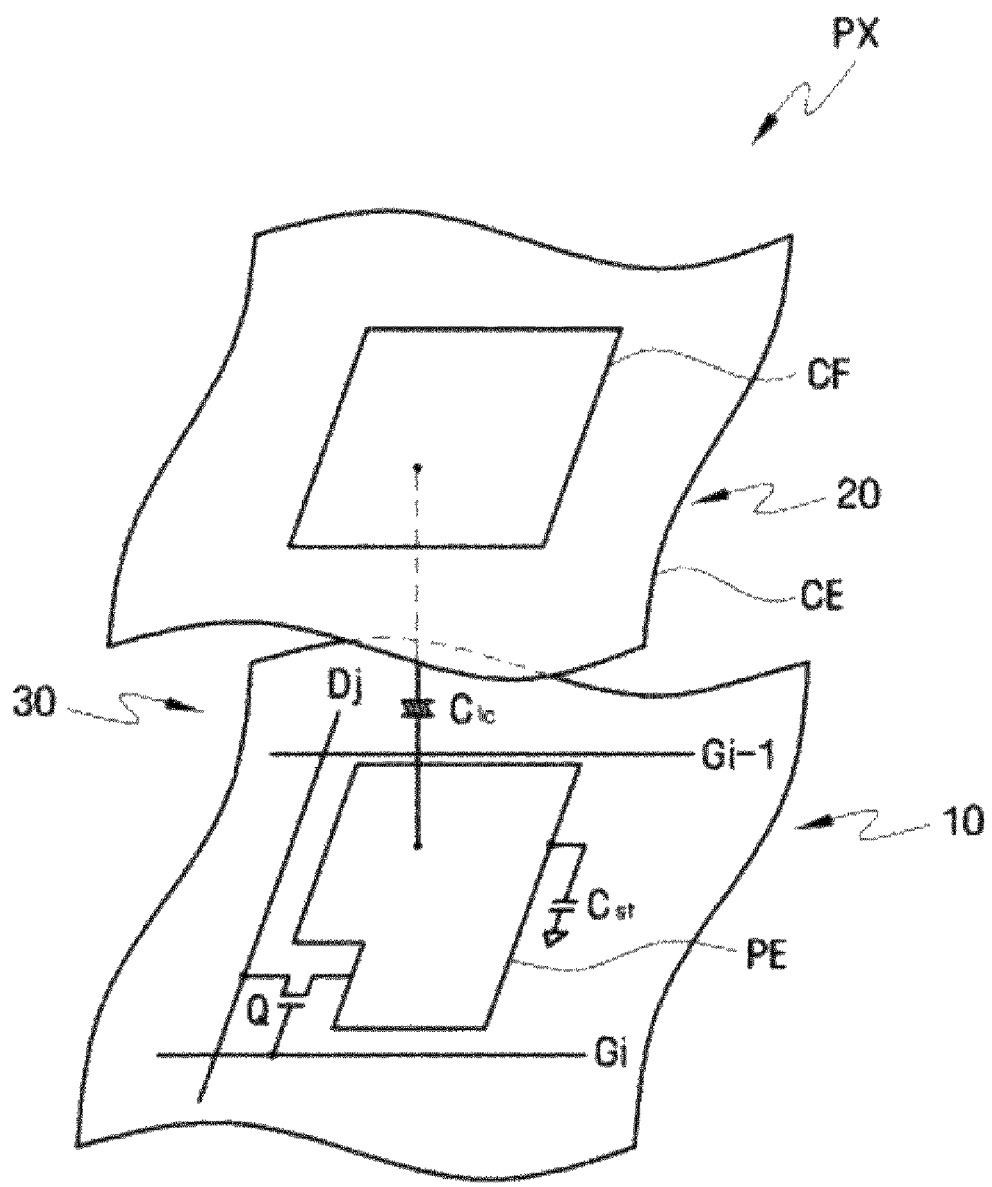
FIG. 2 shows an equivalent circuit diagram of a pixel shown in FIG. 1.
Figure 3:
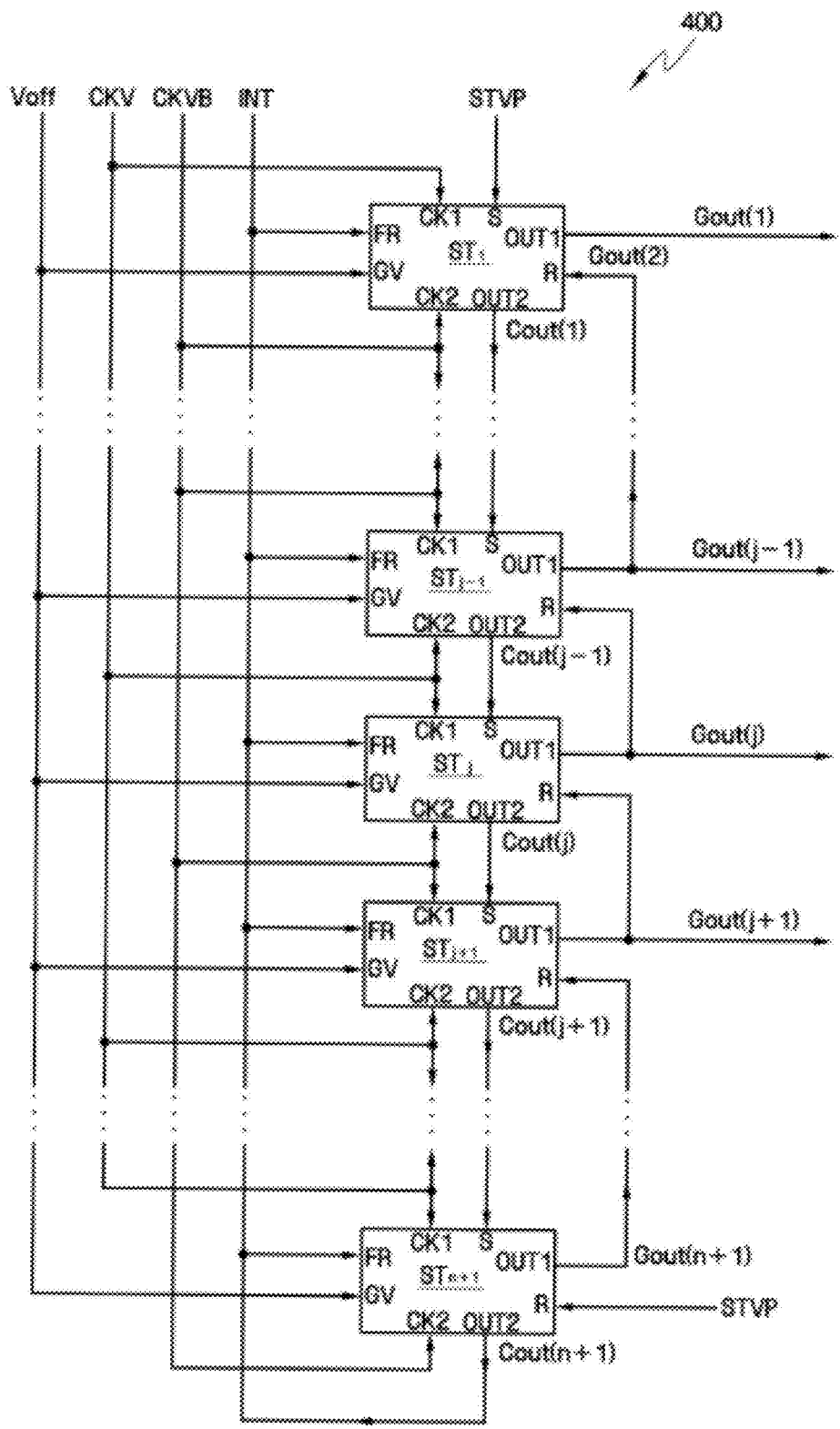
FIG. 3 shows a block diagram of a gate driving module shown in FIG. 1.
Figure 4:
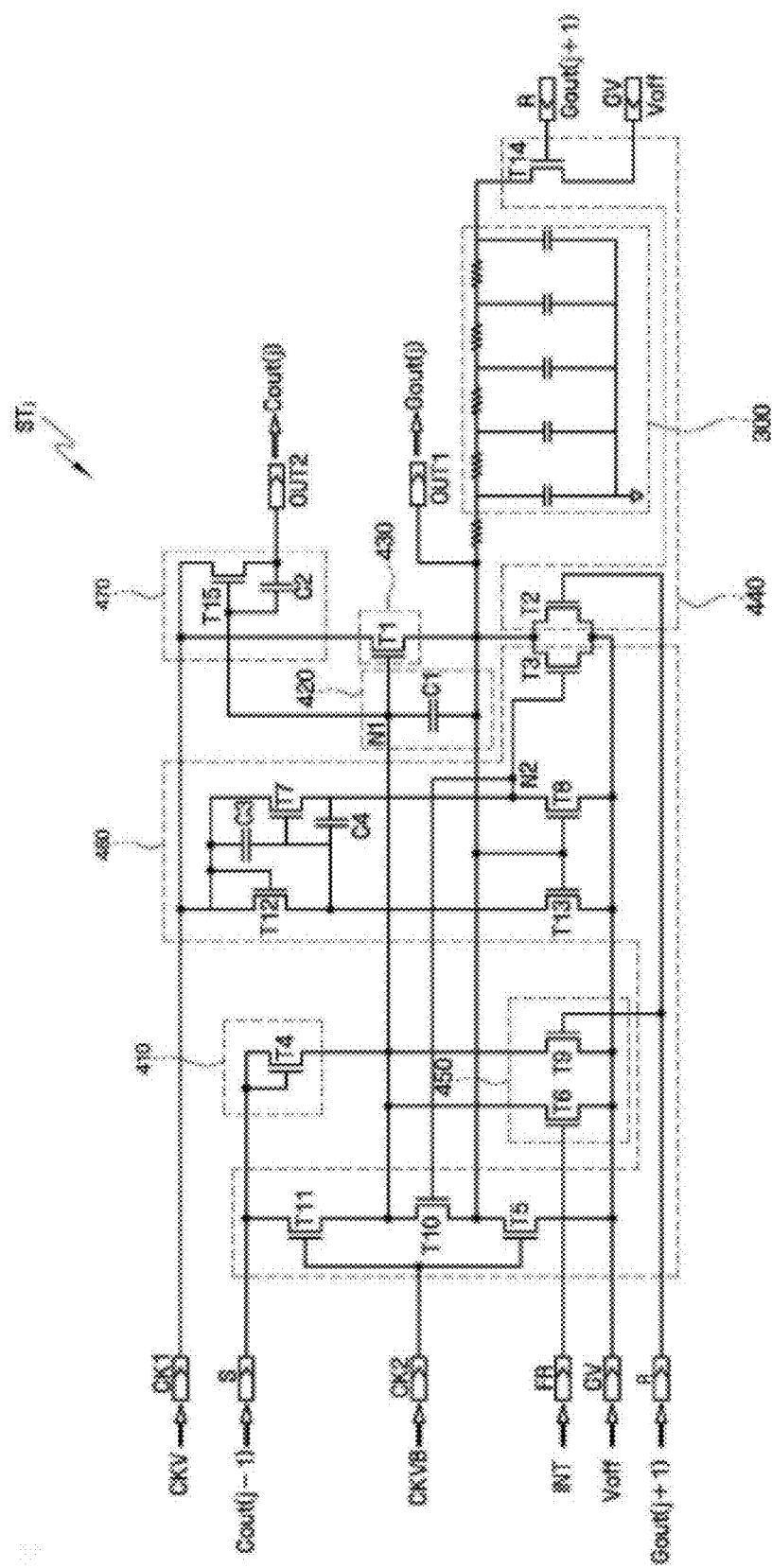
FIG. 4 shows a circuit diagram of a j-th stage shown in FIG. 3.
Figure 5:
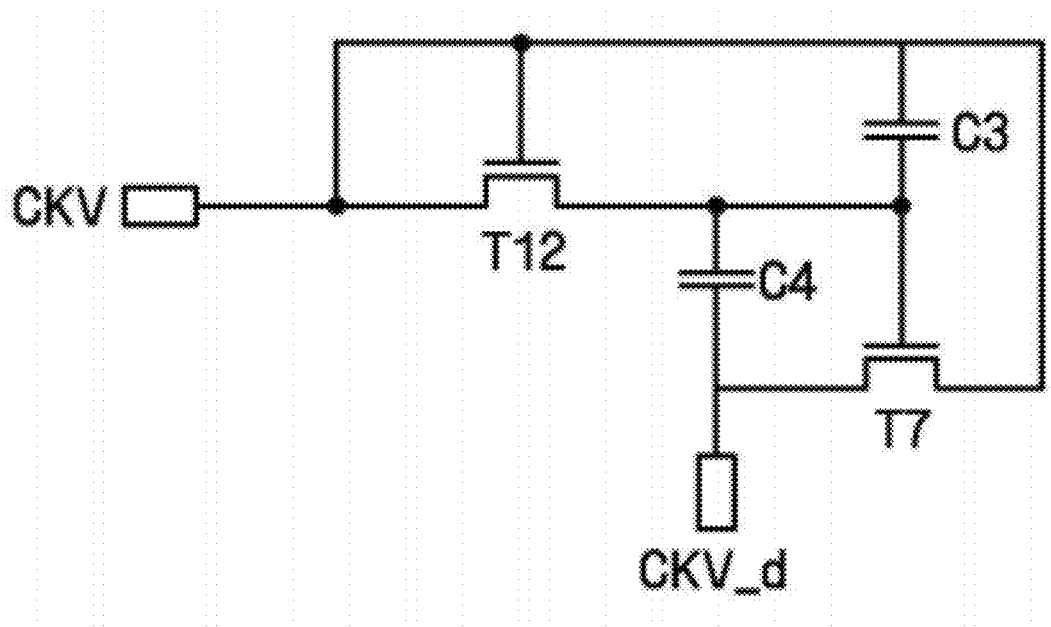
FIG. 5 shows a circuit diagram of a signal delay circuit included in the j-th stage shown in FIG. 3.
Figure 6:
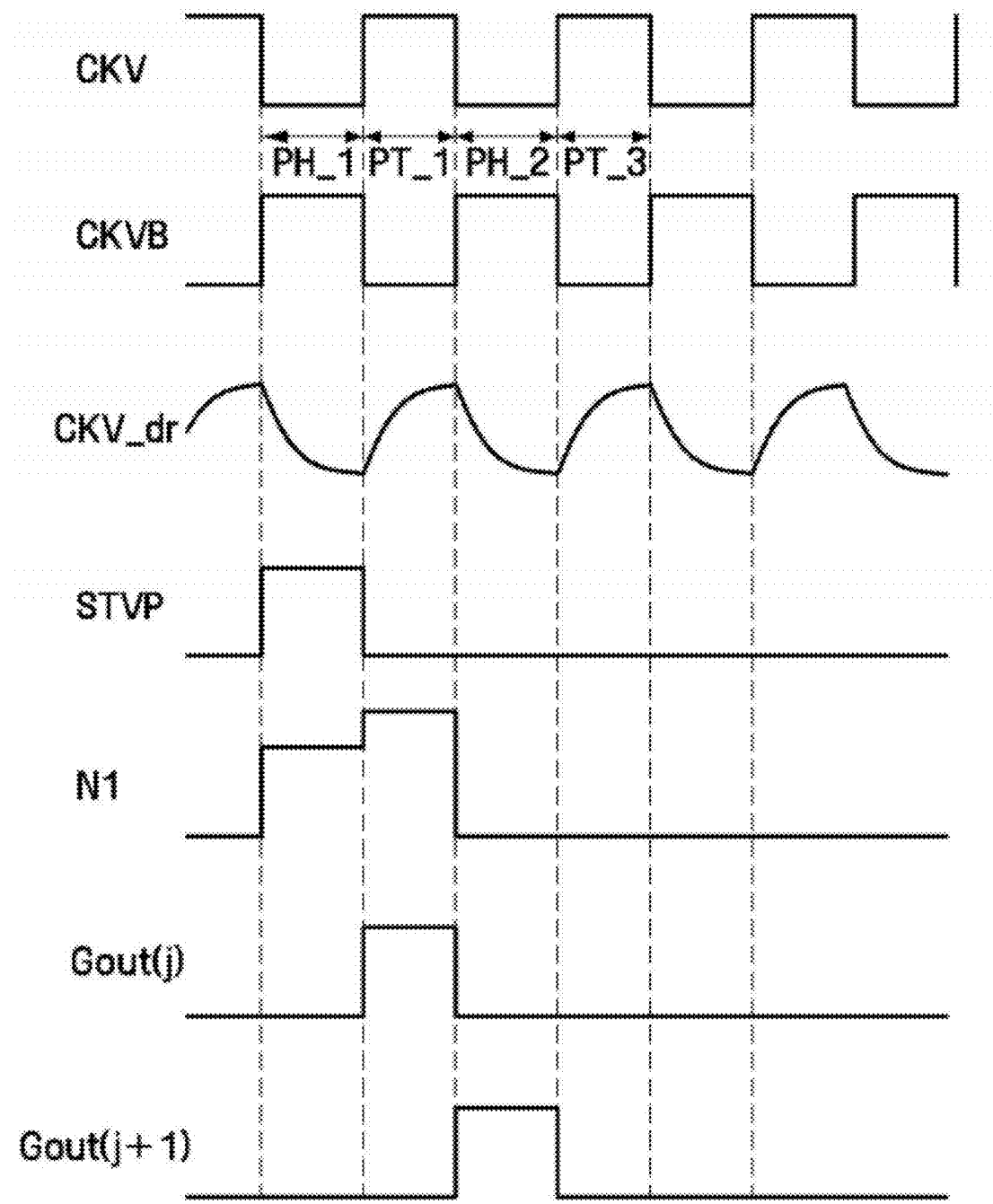
FIG. 6 is a signal diagram for explaining the operation of the j-th stage shown in FIG. 3.

A display device according to an exemplary embodiment of the present invention will hereinafter be described in detail with reference to FIGS. 1 through 6. FIG. 1 shows a block diagram of a display device 1 according to an exemplary embodiment of the present invention, FIG. 2 shows an equivalent circuit diagram of a pixel PX shown in FIG. 1, FIG. 3 shows a block diagram of a gate driving module 400 shown in FIG. 1, FIG. 4 shows a circuit diagram of a j-th stage $ST_j$ shown in FIG. 3, FIG. 5 shows a circuit diagram of a signal delay circuit included in the j-th stage $ST_j$; and FIG. 6 is a signal diagram for explaining the operation of the j-th stage $ST_j$.

Referring to FIG. 1, the display device 1 may include a display panel 300, a signal providing module 100, a gate driving module 400, and a data driving module 200. The signal providing module 100 may include a timing controller 110 and a clock generator 120.

The display panel 300 may be divided into a display area DA in which an image is displayed and a non-display area PA.

The display area DA may include a first substrate (not shown) on which first through n-th gate lines $G_1$ through $G_n$ (where n>2), first through m-th data lines $D_1$ through $D_m$ (where m>2), a plurality of switching elements (not shown), and a plurality of pixel electrodes (not shown) are formed, a second substrate (not shown) on which a plurality of color filters (not shown) and a common electrode (not shown) are formed, and a liquid crystal layer (not shown), which is interposed between the first substrate and the second substrate. The first through n-th gate lines $G_1$ through $G_n$ may extend in a row direction in parallel with one another. The first through m-th data lines $D_1$ through $D_m$ may extend in a column direction in parallel with one another.

The non-display area PA may surround the display area DA. Images are not displayed in the non-display area PA.

The signal providing module 100 may include the timing controller 110 and the clock generator 120. The signal providing module 100 may receive an input image signal (R, G, and B) and a plurality of input control signals, for controlling the display of the input image signal, from an external graphics controller (not shown), and may provide a first image signal DAT and a data control signal CONT to the data driving module 200. More specifically, the timing controller 110 may receive a horizontal synchronization signal $H_{sync}$, a main first clock signal $M_{clk}$, and a data enable signal DE, and may output the first image signal DAT and the data control signal CONT. The data control signal CONT may be a signal for controlling the operation of the data driving module 200. The data control signal CONT may include a horizontal initiation signal for initiating the operation of the data driving module 200 and a load signal for giving instructions to output two data voltages.

The data driving module 200 may receive the first image signal DAT and the data control signal CONT and may provide an image data voltage corresponding to the first image signal DAT to each data line $D_1$ through $D_m$.

The data driving module 200 may be implemented as an integrated circuit (IC) and may be connected to the display panel 300 by tape carrier packages (TCPs). The data driving module 200 may be formed using other methods, such as in the non-display area PA of the display panel 300.

The signal providing module 100 may receive a vertical synchronization signal $V_{sync}$ and the main first clock signal $M_{clk}$ from the external graphics controller, and may receive a gate-on voltage Von and a gate-off voltage Voff from a voltage generation module (not shown). The signal providing module 100 may provide a first scan initiation signal STVP, a first clock signal CKV, a second clock signal CKVB, and the gate-off voltage Voff to the gate driving module 400. More specifically, the timing controller 110 may provide a second scan initiation signal STV, a first clock generation control signal OE, and a second clock generation control signal CPV to the clock generator 120. The clock generator 120 may output the first scan initiation signal STVP using the second scan initiation signal STV. In addition, the clock generator 120 may output the first clock signal CKV and the second clock signal CKVB using the first clock generation control signal OE and the second clock generation control signal CPV. The first clock signal CKV may be an inverted signal of the second clock signal CKVB.

The gate driving module 400 may be driven in response to the first scan initiation signal STVP, may generate a plurality of gate signals based on the first clock signal CKV, the second clock signal CKVB, and the gate-off voltage Voff, and may sequentially provide the gate signals to the first through n-th gate lines $G_1$ through $G_n$.

Referring to FIG. 2, a common electrode CE may be formed on a second substrate 20. A color filter CF may be formed on a portion of the common electrode CE and may face a pixel electrode PE formed on a first substrate 10. A liquid crystal layer 30 may be interposed between the first substrate 10 and the second substrate 20.

A pixel PX, which is connected to an i-th gate line $G_i$ ($1 \leq i \leq n$) and a j-th data line Dj ($1 \leq j \leq m$), may include a switching element Q, which is connected to the i-th gate line Gi and the j-th data line Dj. The switching element Q is also connected to a liquid crystal capacitor $C_{lc}$ and a storage capacitor $C_{st}$. The storage capacitor $C_{st}$ may be omitted. The switching element Q may be an amorphous silicon thin-film transistor (a-Si TFT).

Referring to FIG. 3, the gate driving module 400 may include a plurality of first through (n+1)-th stages $ST_1$ through $ST_{n+1}$, which are connected in cascade. The first through n-th stages $ST_1$ through $ST_n$ may be connected to the first through n-th gate lines $G_1$ through $G_n$, respectively. The first through n-th stages $ST_1$ through $ST_n$ may output first through n-th gate signals Gout(1) through Gout(n), respectively. The gate-off voltage Voff, the first clock signal CKV, the second clock signal CKVB, and an initiation signal INT may be input to each of the first through (n+1)-th stages $ST_1$ through $ST_{n+1}$. Here, the initiation signal INT may be a carry signal Cout(n+1) of the (n+1)-th stage $ST_{n+1}$.

Each of the first through (n+1)-th stages $ST_1$ through $ST_{n+1}$ may include a first clock terminal CK1, a second clock terminal CK2, a set terminal S, a reset terminal R, a power supply terminal GV, a frame reset terminal FR, a gate output terminal OUT1, and a carry output terminal OUT2.

For example, referring to the j-th stage $ST_j$ (where j≠1), which is connected to the j-th gate line $G_j$, a carry signal Cout(−1) of the (j−1)-th stage $ST_{j−1}$ may be input to the set terminal S of the j-th stage $ST_j$; a gate signal Gout(j+1) of the (j+1)-th stage $ST_{j+1}$ may be input to the reset terminal R of the j-th stage $ST_j$; the first clock signal CKV and the second clock signal CKVB may be input to the first clock terminal CK1 and the second clock terminal CK2, respectively, of the j-th stage $ST_j$; the gate-off voltage Voff may be input to the power supply terminal GV of the j-th stage $ST_j$; the initiation signal INT (e.g., the carry signal Cout(n+1) of the (n+1)-th stage $ST_{n+1}$) may be input to the frame reset terminal FR of the j-th stage $ST_j$; the gate signal Gout(j) may be output from the gate output terminal OUT I of the j-th stage $ST_j$; and a carry signal Cout(j) may be output from the carry output terminal OUT2 of the j-th stage $ST_j$.

The first scan initiation signal STVP, instead of a carry signal Cout, may be input to the set terminal S of the first stage $ST_1$. The first scan initiation signal STVP, instead of a gate signal Gout, may also be input to the reset terminal R of the (n+1)-th stage $ST_{n-1}$.

A high-level clock signal may be output from the gate output terminals OUT1 of the first through n-th stages $ST_1$ through $ST_n$. More specifically, a high-level first clock signal CKV may be output from the gate output terminal OUT1 of each odd-numbered stage (i.e., ST1, ST3, . . . ), and a high-level second clock signal CKVB may be output from the gate output terminal OUT1 of each even-numbered stage (e.g., ST2, ST4, . . . ). Therefore, the first through n-th stages may be able to sequentially output the first through n-th gate signals Gout(1) through Gout(n).

The j-th stage $ST_j$ will be described in further detail below with reference to FIG. 4 and FIG. 5.

Referring to FIG. 4, the j-th stage $ST_j$ may include a buffer unit 410, a charging unit 420, a pull-up unit 430, a carry signal generation unit 470, a pull-down unit 440, a discharging unit 450, and a holding unit 460. The j-th stage $ST_j$ may also include a plurality of first through fifteenth transistors T1 through T15. The first through fifteenth transistors T1 through T15 may be TFTs.

The carry signal Cout(j−1) of the (j−1)-th stage $ST_{j-1}$, the first clock signal CKV, and the second clock signal CKVB may be provided to the j-th stage $ST_j$. The first clock signal CKV may include a first section maintained at a low level, a second section that changes from the low level to a high level, and a third section that changes from the high level to the low level.

The buffer unit 410 may include the fourth transistor T4. Gate and drain electrodes of the fourth transistor T4 are both connected to the set terminal S, and a source electrode of the fourth transistor T4 is connected to a first node N1. The buffer unit 410 may receive the carry signal Cout(j−1) of the (j−1)-th stage $ST_{j-1}$ from the set terminal S, and may provide the carry signal Cout(j−1) to the charging unit 420, the carry signal generation unit 470, and the pull-up unit 430.

The charging unit 420 may include a first capacitor C1. A first end of the first capacitor C1 is connected to the source electrode of the fourth transistor T4, the pull-up unit 430, and the discharging unit 450, and a second end of the first capacitor C1 is connected to the gate output terminal OUT1.

The pull-up unit 430 may include the first transistor T1. A drain electrode of the first transistor T1 is connected to the first clock terminal CK1, a gate electrode of the first transistor T1 is connected to the first node N1, and a source electrode of the first transistor T1 is connected to the gate output terminal OUT1.

The carry signal generation unit 470 may include the fifteenth transistor T15 and a second capacitor C2. A drain electrode of the fifteenth transistor T15 is connected to the first clock terminal CK1, and a gate electrode of the fifteenth transistor T15 is connected to the buffer unit 410. The second capacitor C2 is connected between the gate and source electrodes of the fifteenth transistor T15. The carry signal generation unit 470 may output a high-level first clock signal CKV to the carry output terminal OUT2 when the electric potential of the first node N1 changes to a high level.

The pull-down unit 440 may include first and second pull-down transistors, i.e., the second and fourteenth transistors T2 and T14, and may pull down the voltage of the gate signal Gout(j) to the gate-off voltage Voff. The second and fourteenth transistors T2 and T14 may be polycrystalline silicon TFTs. A drain electrode of the second transistor T2 is connected to the source electrode of the first transistor T1 and the second end of the first capacitor C1, a source electrode of the second transistor T2 is connected to the power supply terminal GV, and a gate electrode of the second transistor T2 is connected to the reset terminal R. A source electrode of the fourteenth transistor T14 is connected to the power supply terminal GV, and a drain electrode of the fourteenth transistor T14 is connected to the j-th gate line $G_j$ of the display panel 300.

The discharging unit 450 may include the ninth transistor T9, which discharges the charging unit 420 in response to the gate signal Gout(j+1) of the (j+1)-th stage $ST_{j+1}$, and the sixth transistor T6, which discharges the charging unit 420 in response to the initiation signal INT. A gate electrode of the ninth transistor T9 is connected to the reset terminal R, a drain electrode of the ninth transistor T9 is connected to the first node N1, and a source electrode of the ninth transistor T9 is connected to the power supply terminal GV. A gate electrode of the sixth transistor T6 is connected to the frame reset terminal FR, a drain electrode of the sixth transistor T6 is connected to the first node N1, and a source electrode of the sixth transistor T6 is connected to the power supply terminal GV.

The holding unit 460 may include the third, fifth, seventh, eighth, tenth, eleventh, twelfth, and thirteenth transistors T3, T5, T7, T8, T10, T11, T12, and T13. If the gate signal Gout(j) changes from a low level to a high level, the holding unit 460 may maintain the gate signal Gout(j) at the high level. If the gate signal Gout(j) changes from a high level to a low level, the holding unit 460 may maintain the gate signal Gout(j) at the low level for one frame regardless of the voltage of the first and second clock signals CKV and CKVB.

More specifically, the holding unit 460 may include two transistors T7 and T12, which are capable of generating a delay signal by increasing the time constant of the first clock signal CKV, and two capacitors C3 and C4. Referring to FIG. 5, the first clock signal CKV may be input to a signal delay circuit including the twelfth transistor T12, the seventh transistor T7, the third capacitor C3, and the fourth capacitor C4 through the first clock terminal CK1. The signal delay circuit may output a delay signal CKV_d of the first clock signal CKV through a second node N2, which is shown in FIG. 4.

However, the holding unit is not limited to certainly including the first transistor T12, the second transistor T7, the third capacitor C3 and the fourth capacitor C4. That is, tho holding unit 460 is not limited to including all transistors (T3, T5, T6, T7, T8, T10, T11, T12, T13) in the holding unit 460 of FIG. 4, and it is only necessary to keep the first node signal as the gate signal Gout(j) discharged as the off voltage in response to the delay signal CKV_d of the first clock signal CKV by including a portion of the transistors.

The delay circuit, which can generate a delay signal by increasing the time constant of the first clock signal CKV, may be an element of the holding unit 460, or may be constituted as a separate unit.

Gate and drain electrodes of the twelfth transistor T12 are connected to the first clock terminal CK1, and a source electrode of the twelfth transistor T12 is connected to a gate electrode of the seventh transistor T7. The first clock signal CKV is applied to the gate and drain electrodes of the twelfth transistor T12.

A drain electrode of the seventh transistor T7 is connected to the first clock terminal CK1, and a source electrode of the seventh transistor T7 is connected to the second node N2. The first clock signal CKV is applied to the drain electrode of the seventh transistor T7.

The third capacitor C3 is connected between the gate and drain electrodes of the seventh transistor T7. The third capacitor C3 may delay the time to operate the seventh transistor T7.

The fourth capacitor C4 is connected between the gate and source electrodes of the seventh transistor T7. The third and fourth capacitors C3 and C4 may delay a signal while being charged.

The resistor-capacitor (RC) time constant of the first clock signal CKV, which is input to the signal delay circuit through the first clock terminal CK1, may gradually increase while the first clock signal CKV sequentially passes through the twelfth transistor T12, the seventh transistor T7, the third capacitor C3, and the fourth capacitor C4. As a result, the first clock signal CKV may be delayed. In addition to the third and fourth capacitors C3 and C4, the parasitic capacitors of the twelfth and seventh transistors T12 and T7 may also increase the RC time constant of the first clock signal CKV. That is, in order to increase the time constant of the first clock signal CKV, the signal delay circuit may not necessarily include all of the twelfth transistor T12, the seventh transistor T7, the third capacitor C3, and the fourth capacitor C4. The signal delay circuit may increase the time constant of the first clock signal CKV by using only some of the twelfth transistor T12, the seventh transistor T7, the third capacitor C3, and the fourth capacitor C4.

The holding unit 460 may also include the tenth transistor T10, which prevents ripples and stabilizes the first node N1.

A drain electrode of the tenth transistor T10 is connected to the first node N1, a source electrode of the tenth transistor T10 is connected to the gate output terminal OUT1, and a gate electrode of the tenth transistor T10 is connected to the second node N2. The delay signal CKV_d is applied to the gate electrode of the tenth transistor T10. Thus, the time to operate the tenth transistor T10 may be delayed, as compared to the case when the first clock signal CKV is applied to the gate electrode of the tenth transistor T10. Therefore, it is possible to secure sufficient time to charge the first node N1.

The tenth transistor T10 may be implemented as an a-Si TFT having a mobility of 2-10 $cm^2/Vs$. In this case, it is possible to secure sufficient time to charge the first node N1.

The operation of the j-th stage $ST_j$ will be described in detail below with reference to FIG. 4, FIG. 5, and FIG. 6.

The transition of the voltage of the gate signal Gout(j) from the gate-off voltage Voff to the gate-on voltage Von will be described below.

The charging unit 420 may be charged by being provided with the carry signal Cout(j−1) of the (j−1)-th stage $ST_{j-1}$. For example, the charging unit 420 may be charged by being provided with the carry signal Cout(j−1) or the first scan initiation signal STVP during a first sustain period PH_1. Then, the voltage of the first node N1 may gradually increase. During a first transition period PT_1, if a first clock signal CKV whose level changes from a low level to a high level is received, the voltage of the first node N1 may further increase due to a parasitic capacitor (not shown) between the first transistor T1 and the first node N1.

If the voltage of the charging unit 420, i.e., the voltage of the first node N1, reaches a first charge level, e.g., a positive level, as shown in FIG. 6, the first transistor T1 of the pull-up unit 430 may be turned on, and may thus output the first clock signal CKV through the gate output terminal OUT1 as the gate signal Gout(j). That is, the voltage of the gate signal Gout(j) may be the same as the gate-on voltage Von. In addition, the fifteenth transistor T15 of the carry signal generation unit 470 may also be turned on, and may thus output the first clock signal CKV through the carry output terminal OUT2 as the carry signal Cout(j).

The transition of the voltage of the gate signal Gout(j) from the gate-on voltage Von to the gate-off voltage Voff will hereinafter be described in detail.

During a second sustain period PH_2, if the first clock signal CKV changes from a high level to a low level, the voltage of the first node N1 may drop due to the parasitic capacitor between the first transistor T1 and the first node N1. In this case, the gate signal Gout(j+1) of the (j+1)-th stage $ST_{j+1}$ may have a high level. Thus, the ninth transistor T9 of the discharging unit 450 may be turned on, and may thus provide the gate-off voltage Voff to the first node N1. Since the second clock signal CKVB changes from a low level to a high level, the eleventh transistor T11 of the holding unit 460 may be turned on and may thus provide the carry signal Cout(j−1) to the first node N1.

That is, when the gate signal Gout(j+1) of the (j+1)-th stage $ST_{j+1}$ has a high level, the first transistor T1 of the pull-up unit 430 of the (j)-th stage $ST_j$ may not be turned off, and may output a low-level first clock signal CKV as the gate signal Gout(j). Because the pull-down unit 440 drops the voltage of the gate signal Gout(j) to the gate-off voltage Voff, and the pull-up unit 430 provides the low-level first clock signal CKV as the gate signal Gout(j), the voltage of the gate signal Gout(j) may be rapidly pulled down to the gate-off voltage Voff. Thus, the gate signal Gout(j) may not overlap with the gate signal Gout(j+1) of the (j+1)-th stage $ST_{j+1}$.

It will be described below how the gate signal Gout(j) is maintained at the gate-off voltage Voff for one frame after pulling down the voltage of the gate signal Gout(j) to the gate-off voltage Voff.

Once the voltage of the gate signal Gout(j) is pulled down to the gate-off voltage Voff, the eighth and thirteenth transistors T8 and T13 may be turned on. The thirteenth transistor T13 may turn off the seventh transistor T7, and may thus prevent a high-level first clock signal CKV from being provided to the third transistor T3. The eighth transistor T8 may turn off the third transistor T3. As a result, the gate signal Gout(j) may be maintained at a high level.

Thereafter, if the gate signal Gout(j) changes from a high level to a low level, the eighth and thirteenth transistors T8 and T13 may be turned off. If the first clock signal CKV has a high level, the seventh and twelfth transistors T7 and T12 may turn off the third transistor T3, and may thus maintain the gate signal Gout(j) at a low level. In addition, the tenth transistor T10 may be turned on and may thus maintain the gate signal Gout(j) at a low level. As a result, a high-level first clock signal CKV may not be output to the gate output terminal OUT1. The second clock signal CKVB may have a high level, and the fifth and eleventh transistors T5 and T11 may be turned on. The fifth transistor T5 may maintain the gate signal Gout(j) at a low level, and the eleventh transistor T11 may maintain the first end of the first capacitor C1 at a low level. Therefore, the gate signal Gout(j) may be maintained at a low level for one frame.

Alternatively, the j-th stage $ST_j$ may not include the carry signal generation unit 470. In this case, the j-th stage $ST_j$ may receive the gate signal Gout(j−1) of the (j−1)-th stage $ST_{j-1}$, instead of the carry signal Cout(j−1) of the (j−1)-th stage $ST_{j-1}$, and may thus operate in response to the gate signal Gout(j−1).

The delay signal CKV_d of the first clock signal CKV may be applied to the holding unit 460. The dropping of the voltage of the first node N1 by the holding unit 460 will be described in detail below.

The time constant of the first clock signal CKV may increase while the first clock signal CKV passes through the signal delay circuit shown in FIG. 5. As a result, the delay signal CKV_d of the first clock signal CKV may be generated. Referring to FIG. 6, the points at which the voltage of the delay signal CKV_d of the first clock signal CKV increases and decreases may be synchronized with the same points of the first clock signal CKV. However, time delays may occur in the increase and decrease of the voltage of the delay signal CKV_d.

During the first sustain period PH_1, if the first clock signal CKV changes from a high level to a low level, the first node N1 may be charged by being provided with the first scan initiation signal STVP, and thus, the voltage of the first node N I may gradually increase. During the first transition period PT_1, if a first clock signal CKV whose level changes from a low level to a high level is applied, the voltage of the first node N1 may further increase due to the parasitic capacitor between the first transistor T1 and the first node N1. In this case, the holding unit 460 may receive the delay signal CKV_d of the first clock signal CKV and may thus drop the voltage of the first node N1 to the level of the gate signal Gout(j).

Since the holding unit 460 drives the tenth transistor T10 in response to the delay signal CKV_d of the first clock signal CKV, the holding unit 460 may be able to drive the tenth transistor T10 after waiting for the voltage of the first node N1 to increase sufficiently. In short, it is possible to sufficiently increase the voltage of the first node N1 by applying the delay signal CKV_d of the first clock signal CKV to the holding unit 460. Therefore, it is possible to secure the driving margin of a gate driving circuit.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A gate driving circuit comprising a shift register having a plurality of stages dependently connected to one another, wherein each stage comprises:
   a pull-up unit to output a first clock signal as a gate signal in response to a signal of a first node, the first node to receive a first input signal;
   a pull-down unit to discharge the gate signal to a gate-off voltage in response to a second input signal;
   a discharging unit to discharge the signal of the first node to the gate-off voltage in response to the second input signal;
   a holding unit to maintain the signal of the first node at the gate-off voltage in response to a delay signal of the first clock signal; and
   wherein the holding unit comprises a transistor having a gate electrode to receive the delay signal of the first clock signal, a drain electrode connected to the first node, and a source electrode connected to a gate line.

2. The gate driving circuit of claim 1, wherein the delay signal of the first clock signal is obtained by increasing a time constant of the first clock signal.

3. The gate driving circuit of claim 1, wherein the first clock signal is applied to the holding unit through a capacitor.

4. The gate driving circuit of claim 3, wherein the capacitor is a parasitic capacitor of a thin-film transistor.

5. The gate driving circuit of claim 1, further comprising a first transistor and a second transistor, the first transistor and the second transistor to delay the first clock signal, wherein:
   the first clock signal is applied to a drain electrode of the first transistor, a drain electrode of the second transistor, and a gate electrode of the first transistor;
   a source electrode of the first transistor is connected to a gate electrode of the second transistor; and
   a source electrode of the second transistor applies the delay signal of the first clock signal to the holding unit.

6. The gate driving circuit of claim 5, further comprising a capacitor connected between the drain electrode and the gate electrode of the second transistor.

7. The gate driving circuit of claim 5, further comprising a capacitor connected between the gate electrode and the source electrode of the second transistor.

8. The gate driving circuit of claim 1, wherein the transistor has a mobility in the range of 2 cm$^2$/Vs to 10 cm$^2$/Vs.

9. A display device comprising:
   a display panel comprising a plurality of pixels and a plurality of signal lines connected to the plurality of pixels;
   a shift register having a plurality of stages dependently connected to one another, wherein each stage is respectively connected to a signal line of the plurality of signal lines and each stage comprises:
   a pull-up unit to output a first clock signal as a gate signal in response to a signal of a first node, the first node to receive a first input signal;
   a pull-down unit to discharge the gate signal to a gate-off voltage in response to a second input signal;
   a discharging unit to discharge the signal of the first node to the gate-off voltage in response to the second input signal;
   a holding unit to maintain the signal of the first node at the gate-off voltage in response to a delay signal of the first clock signal; and
   wherein the holding unit comprises a transistor having a gate electrode to which the delay signal of the first clock signal is applied, a drain electrode connected to the first node, and a source electrode connected to the signal line, the signal line being a gate line.

10. The display device of claim 9, wherein the delay signal of the first clock signal is obtained by increasing a time constant of the first clock signal.

11. The display device of claim 9, wherein the first clock signal is applied to the holding unit through a capacitor.

12. The display device of claim 11, wherein the capacitor is a parasitic capacitor of a thin-film transistor.

13. The display device of claim 10, further comprising a first transistor and a second transistor, the first transistor and the second transistor to delay the first clock signal, wherein:
   the first clock signal is applied to a drain electrode of the first transistor, a drain electrode of the second transistor, and a gate electrode of the first transistor;
   a source electrode of the first transistor is connected to a gate electrode of the second transistor; and
   a source electrode of the second transistor applies the delay signal of the first clock signal to the holding unit.

14. The display device of claim 13, further comprising a capacitor connected between the drain electrode and the gate electrode of the second transistor.

15. The display device of claim 13, further comprising a capacitor connected between the gate electrode and the source electrode of the second transistor.

16. The display device of claim 9, wherein the transistor has a mobility in the range of 2 cm$^2$/Vs to 10 cm$^2$/Vs.

* * * * *